United States Patent [19]
Arghavani et al.

[11] Patent Number: 6,153,480
[45] Date of Patent: Nov. 28, 2000

[54] ADVANCED TRENCH SIDEWALL OXIDE FOR SHALLOW TRENCH TECHNOLOGY

[75] Inventors: Reza Arghavani, Terrace Aloha; Robert S Chau; Binny Arcot, both of Beaverton, all of Oreg.

[73] Assignee: Intel Coroporation, Santa Clara, Calif.

[21] Appl. No.: 09/164,112

[22] Filed: Sep. 30, 1998

Related U.S. Application Data

[63] Continuation-in-part of application No. 09/075,490, May 8, 1998.

[51] Int. Cl.[7] .......................... H01L 21/336; H01L 21/76
[52] U.S. Cl. ........................... 438/296; 438/424; 438/435
[58] Field of Search .................................. 438/296, 424, 438/435

[56] References Cited

U.S. PATENT DOCUMENTS

| | | |
|---|---|---|
| 3,976,524 | 8/1976 | Feng . |
| 4,871,689 | 10/1989 | Bergami et al. . |
| 4,960,727 | 10/1990 | Mattox . |
| 5,004,703 | 4/1991 | Zdebel et al. . |
| 5,387,540 | 2/1995 | Poon et al. . |
| 5,492,858 | 2/1996 | Bose et al. . |
| 5,780,346 | 7/1998 | Arghavani et al. . |
| 5,877,057 | 3/1999 | Gardner et al. . |
| 5,970,363 | 10/1999 | Kepler et al. . |
| 5,976,951 | 11/1999 | Huang et al. . |
| 5,985,735 | 11/1999 | Moon et al. . |
| 5,989,978 | 11/1999 | Peidous . |

FOREIGN PATENT DOCUMENTS

| | | |
|---|---|---|
| 360132341 | 7/1985 | Japan . |
| 402010851 | 1/1990 | Japan . |
| 407307382 | 11/1995 | Japan . |

*Primary Examiner*—Savitri Mulpuri
*Assistant Examiner*—Josetta Jones
*Attorney, Agent, or Firm*—Blakely, Sokoloff, Taylor & Zafman LLP

[57] ABSTRACT

A method of forming an isolation structure in a semiconductor substrate is described. A trench is first etched into a semiconductor substrate. The trench is subjected to a nitrogen-oxide gas ambient and is annealed to form a silicon-oxynitride surface along the trench sidewalls. A first oxide layer is then formed within the trench. The first oxide layer is subjected to a nitridation step and is annealed to form an oxy-nitride surface on the first oxide layer and a silicon-oxynitride interface between the first oxide layer and the semiconductor substrate. A second oxide layer is then deposited over the oxy-nitride surface of the first oxide layer. The method and isolation structure of the present invention reduce dopant outdiffusion, reduce trench stresses, allow more uniform growth of thin gate oxides, and permit the use of thinner gate oxides.

28 Claims, 7 Drawing Sheets

ADVANCED TRENCH SIDEWALL OXIDE FOR SHALLOW TRENCH TECHNOLOGY

RELATED APPLICATIONS

The present invention is a continuation-in-part to U.S. patent application, Ser. No. 09/075,490, filed May 8, 1998, and entitled "N$_2$O Nitrided-Oxide Trench Sidewalls to Prevent Boron Outdiffusion and Decrease Stress".

BACKGROUND OF THE INVENTION

1. Field of the Invention

The present invention relates generally to the field of semiconductor processing, and more particularly, to a trench isolation process.

2. Description of the Related Art

As the demand for cheaper, faster, lower power consuming microprocessors increases, so must the device packing density of the integrated circuit (IC). All aspects of the IC must be scaled down to fully minimize the dimensions of the circuit. In addition to minimizing transistor dimensions, one must minimize the dimensions of the field regions (or isolation regions) which serve to physically and electrically isolate one semiconductor device from an adjacent semiconductor device on a semiconductor substrate, so that each device can operate independently of the other.

In general, the number of transistors that can be built on a silicon substrate is limited only by the size of the transistors and available surface area on the substrate. Transistors can only be built in active regions of a silicon substrate, with isolation regions of the substrate dedicated to separating active regions from one another. Therefore, to maximize the number of transistors on the surface of a silicon substrate, it is necessary to maximize the available active surface area of the substrate. The active surface area is maximized by, in turn, minimizing the isolation regions of the silicon substrate. In order to fully minimize an isolation region, the width of the isolation region should approach the minimum width printable by a given photolithographic technology.

One technology developed to form such isolation regions is known as trench technology. A trench isolation structure is formed in a silicon substrate by etching a trench region into the substrate and subsequently refilling the trench with some type of trench fill material. Thereafter, active regions adjacent to the trench isolation structure are available for conventional semiconductor processing to form transistors on the semiconductor device. For example, FIG. 1 provides a cross-sectional view of a semiconductor substrate 110 with a trench isolation structure formed therein. A trench sidewall oxide 160 lines the sidewalls of the trench, with the trench then filled in with an oxide to form the trench fill oxide 170. When forming a transistor adjacent to the trench, a gate insulating oxide layer 180 is grown over the substrate and over the trench.

There are several problems, however, that result from use of the trench isolation technology described briefly above. One such problem is the formation of the "bird's beak" or sharp top corners 190 of the trench. Sharp top corners 190 of the trench may carry stronger electric fields (e-fields) and cause problems later when forming active regions on either side of the trench. Because the top corners 190 of the trench are sharp, the thickness of the gate oxide layer 180 around the top corners 190 becomes very thin and the gate oxide layer 180 cannot be grown with uniform thickness. A thin gate oxide layer may break down if subjected to high electric fields. For example, once a transistor is formed and is functioning, the sharp top corners 190 create a high e-field and the thin gate oxide layer 180 may be subject to failure causing undesirable parasitic capacitances and leakage voltages that degrade device performances. As a result, the isolation technique described above is limited to fabricating devices that use a thin gate oxide layer of greater than 32 Å.

Sharp top corners can also cause a problem when filling the trench. As stated above, the trench is generally filled using chemical vapor deposition (CVD) techniques to fill the trench with materials such as an oxide, polysilicon, or a combination thereof. CVD processes subject the structure to plasma which also induces (or creates) an electric field around the sharp corners causing a non-uniform deposition process and may create gaps or voids in the trench fill.

Another problem resulting from trench isolation technology is the outdiffusion of dopants from the semiconductor device region, for example from the source 220 and drain 230 regions of a transistor (see FIG. 2), into the trench 245 region. Outdiffusion is especially prominent in N-channel transistors that have narrow widths. (Note that P-channel transistors may also have narrow widths, but N-channel transistors are more susceptible to outdiffusion because of boron well.) Thus, as device dimensions decrease (i.e., develop narrower widths) the susceptibility to outdiffusion increases. Outdiffusion of the dopants from the device region has several effects. It is well known in the art that the higher the dopant concentration the higher the threshold voltage of the transistor. Thus, dopant outdiffusion from the device region into the channel reduces the dopant concentration of the transistor and thus decreases the threshold voltage of the device. For example, if dopants in region 250 adjacent source region 220 outdiffuse into trench 245, then the dopant concentration in region 250 will be less than the dopant concentration in region 255. Therefore, the threshold voltage in region 250 will be less than the threshold voltage in the region 255.

The outdiffusion of dopants may also increase the off-leakage current. The off-leakage current is the parasitic (i.e., bad or unwanted) current that flows from the source 220 to the drain 230 of the transistor when the voltage applied to the gate 240 is zero ($V_g=0$), and the drain voltage ($V_d$) is at power supply voltage ($V_{cc}$) (i.e., in general a power supply may be $V_{cc}=1.8$ volts). It is desirable for the off-leakage current to be minimized such that the voltage at the source is zero ($V_s=0$). However, if the dopants outdiffuse into the trench, for example, dopants near the source region (e.g., dopants from region 250) diffuse into the trench, then the threshold voltage near the source region becomes less than the threshold voltage in the channel and drain regions and may allow parasitic current to flow from the source 220 to the drain 230.

One example of a prior art method for forming trench isolation structures that reduce dopant outdiffusions while allowing uniform deposition of thin gate oxides is illustrated in FIGS. 3A–K. FIG. 3A illustrates a semiconductor substrate 310 with a pad oxide layer 320 and a polish stop layer 330 deposited thereon. Polish stop layer 330 and pad oxide layer 320 are then patterned and etched (typically using well known photolithographic masking and etching techniques) to form an opening 340, as illustrated in FIG. 3B.

After polish stop layer 330 and pad oxide 320 are patterned, the substrate 320 is etched to form a trench 345, as illustrated in FIG. 3C. After trench 345 is etched, however, the sidewalls of the trench are not clean, and so a preclean step is performed to remove debris from the trench sidewalls. The trench preclean step is performed using a chemistry made up of SC1, SC2, and HF, wherein SC1 is a combination of $NH_4OH$, $H_2O_2$, and $H_2O$. The preclean step is performed long enough that the preclean consumption chemistry will consume some of the silicon semiconductor substrate 310. The of the silicon during the preclean step rounds the sharp top corners 390 of the trench beginning the reduction of the "bird's beak" effect and the formation of rounded top corners 395, as illustrated in FIG. 3D. Because the top corners of trench 345 are rounded, they will not tend to carry high electric fields and will permit the deposition of a more uniform thin gate oxide 380 (illustrated in FIG. 3K) for the formation of a semiconductor device in the active region adjacent the trench.

Trench sidewall oxide 360 is then formed in the trench, as illustrated in FIG. 3E. Trench sidewall oxide 360 is typically grown at an approximate temperature of 1000° C. to an approximate thickness of 250 Å. The oxidation process occurring at 1000° C. continues the reduction of the "bird's beak" and the formation of rounded top corners 395. After the trench sidewall oxide 360 is formed, trench sidewall oxide 360 is subjected to an $N_2O$ nitridation step in a nitrogen-oxide ($N_2O$) gas ambient and anneal step, as illustrated in FIG. 3E. The nitridation and anneal steps form an oxy-nitride surface 365 on the first oxide layer, which reduces the stresses in the trench, and a silicon oxy-nitride interface (barrier) 366 between the semiconductor substrate and the first oxide layer, which helps to eliminate dopant outdiffusion from the active region that is adjacent to the trench 345, as illustrated in FIG. 3F.

Next, the trench is filled in with an oxide (typically using chemical vapor deposition (CVD) techniques) to form trench fill oxide 370, as illustrated in FIG. 3G. The trench fill oxide 370 is then polished (or planarized) in order to remove the excess oxide above polish stop layer 330, as illustrated in FIG. 3H. As illustrated in FIG. 3I, polish stop layer 330 is then removed (typically using conventional etch techniques). After polish stop layer 330 is removed, an etch-back step is performed (typically using chemical mechanical polishing (CMP) techniques) in order to isolate trench sidewall oxide 360 and trench fill oxide 370 within the trench, as illustrated in FIG. 3J.

When forming a transistor adjacent to the trench, a gate insulating oxide layer is grown over the substrate and over the trench, and since the top corners of the trench are rounded, the gate oxide layer 380 is grown with a uniform thickness. As illustrated in FIG. 3K, the thickness of the thin gate oxide layer 380 at rounded top corners 395 is the same thickness (i.e. uniform thickness) as the gate oxide layer that lies on the horizontal surfaces of trench 345 and substrate 310. Thus, the thin gate oxide layer 380 is not as susceptible to breakdown when subjected to high electric fields.

The above described method of using $N_2O$ nitrided-oxide trench sidewalls when fabricating isolation structures has proven beneficial when dealing with device dimensions in the $0.25\mu$–$0.35\mu$ technology area. However, the demand for cheaper, faster, lower power consuming microprocessors continues to increase, with $0.18\mu$ device dimensions and lower often required. To make advances in this technology, it is desirable to control the thickness of the trench sidewall oxide layer below 200 Å and yet still grow such a chlorinated oxide at a high temperature. However, the thickness of such an oxide cannot currently be controlled below 200 Å in the desired range of temperatures. Thus, a trench isolation structure and a method for making that structure that will reduce dopant outdiffusions, will allow uniform deposition of thin gate oxides, and will permit the use of thinner gate oxides is desired.

SUMMARY OF THE INVENTION

A method of forming an isolation structure in a semiconductor substrate is described. A trench is first formed in a semiconductor substrate. The trench is then exposed to an ambient comprising nitrogen. An oxide layer is then formed within the trench. The oxide layer is then exposed to an ambient comprising nitrogen. Additional features and benefits of the present invention will become apparent from the detailed description, figures, and claims set forth below.

DESCRIPTION OF THE INVENTION

An improved method for forming $N_2O$ nitrided-oxide trench sidewalls that reduce boron outdiffusion and decrease stress is disclosed. In the following description, numerous specific details are set forth such as specific materials, process parameters, dimensions, etc. in order to provide a thorough understanding of the present invention. It will be obvious, however, to one skilled in the art that these specific details need not be employed to practice the present invention. In other instances, well-known materials or methods have not been described in detail in order to avoid unnecessarily obscuring the present invention.

Embodiments of the present invention provide a trench isolation structure and a method for making that structure that will reduce dopant out diffusion and also allow substantially uniform deposition of thin gate oxides. In the manufacture of semiconductor devices embodiments of the present invention are employed to form a barrier between the trench and an active region so that the dopants of the active region are not able to outdiffuse into the trench.

Figure 1:
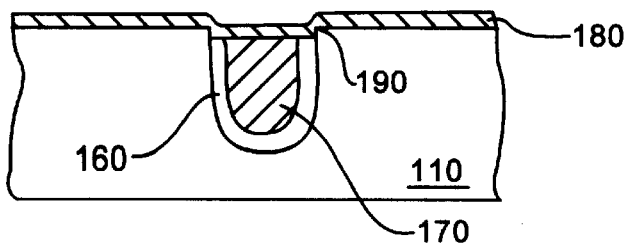
FIG. 1 illustrates a cross-sectional view of a semiconductor substrate with a trench isolation structure of the prior art formed therein.
Figure 2:
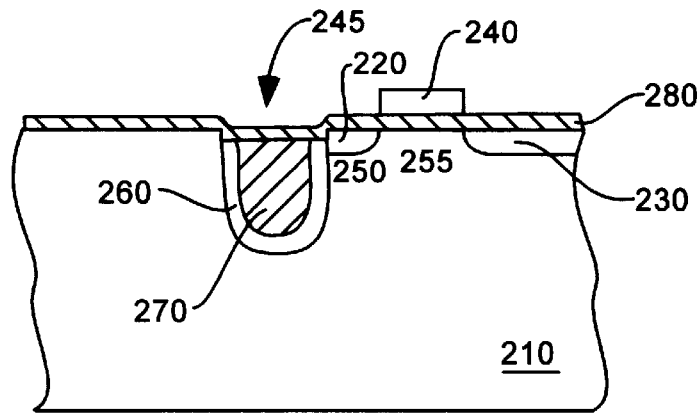
FIG. 2 illustrates a prior art trench isolation structure adjacent an active region.
Figure 3A:
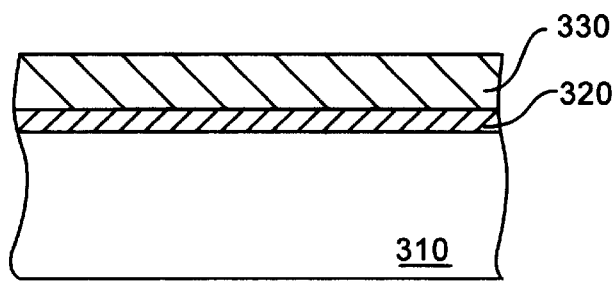
FIG. 3A illustrates a cross-sectional view of a semiconductor substrate with a pad oxide layer and a polish stop layer deposited thereon.
Figure 3B:
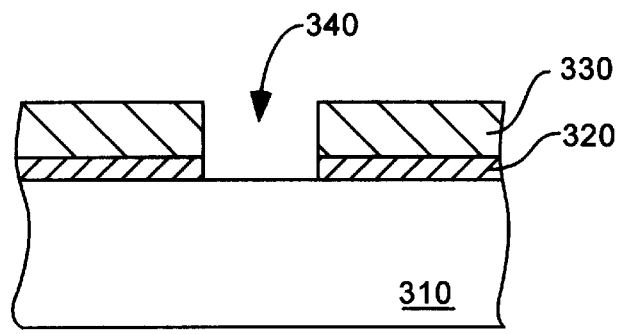
FIG. 3B illustrates a cross-sectional view of the structure in FIG. 3A after the pad oxide layer and polish stop layer have been patterned.
Figure 3C:
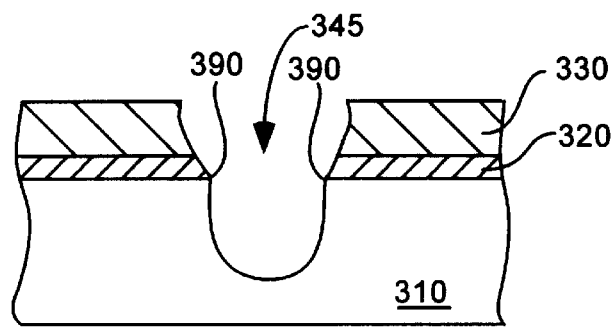
FIG. 3C illustrates a cross-sectional view of structure in FIG. 3B after a trench has been etched in the semiconductor substrate.
Figure 3D:
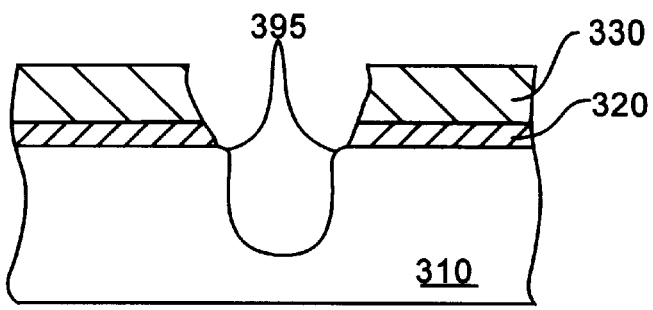
FIG. 3D illustrates a cross-sectional view of the structure in FIG. 3C after a preclean step has been performed which rounds the top corners of the trench.
Figure 3E:
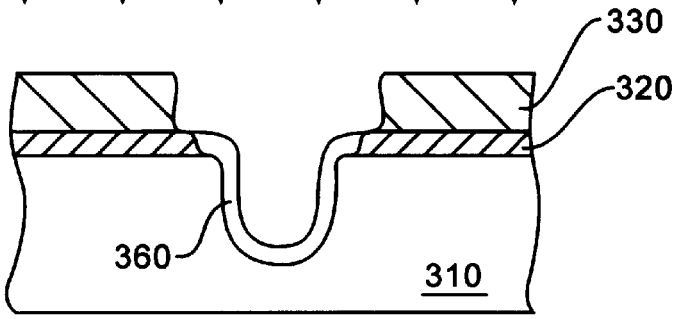
FIG. 3E illustrates a cross-sectional view of the structure in FIG. 3D during an $N_2O$ nitridation and anneal step.
Figure 3F:
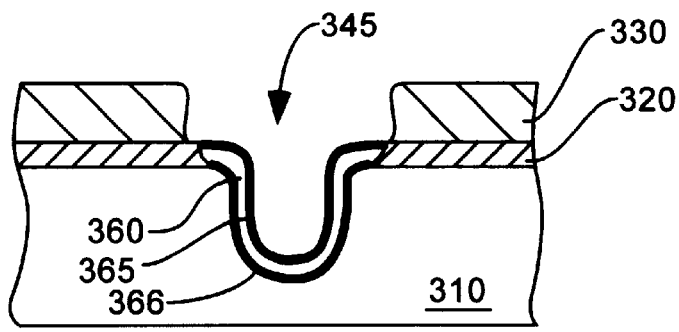
FIG. 3F illustrates a cross-sectional view of the structure in FIG. 3E after the oxy-nitride surface and silicon-oxy-nitride interface have been formed.
Figure 3G:
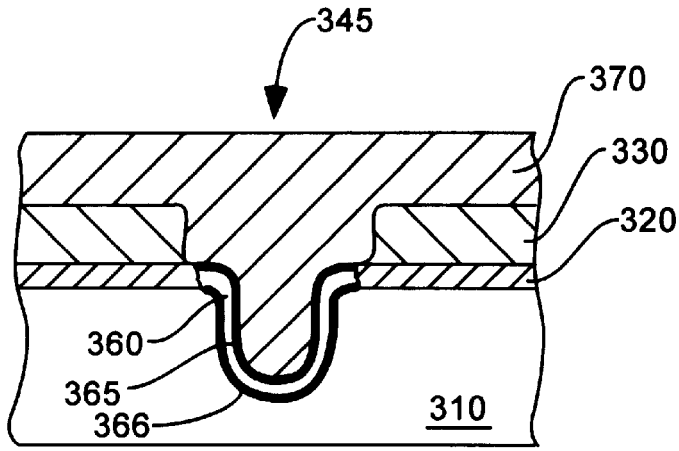
FIG. 3G illustrates a cross-sectional view of the structure in FIG. 3F after the trench has been completely filled with an oxide.
Figure 3H:
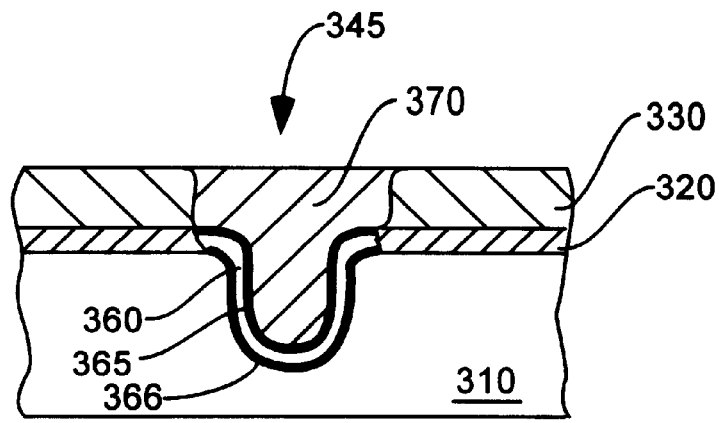
FIG. 3H illustrates a cross-sectional view of the structure in FIG. 3G after a polish step has been performed.
Figure 3I:
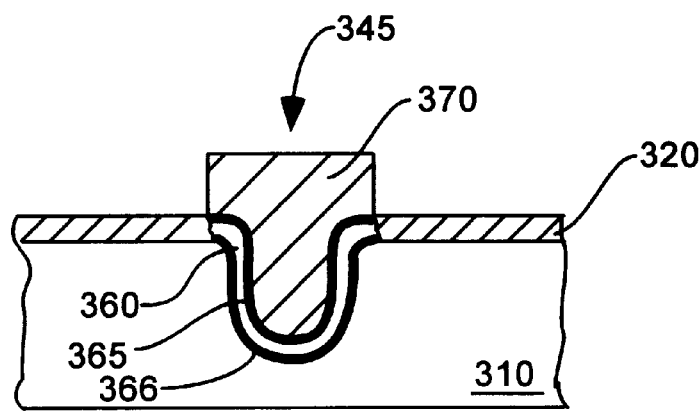
FIG. 3I illustrates a cross-sectional view of the structure in FIG. 3H after the polish stop layer has been removed.
Figure 3J:
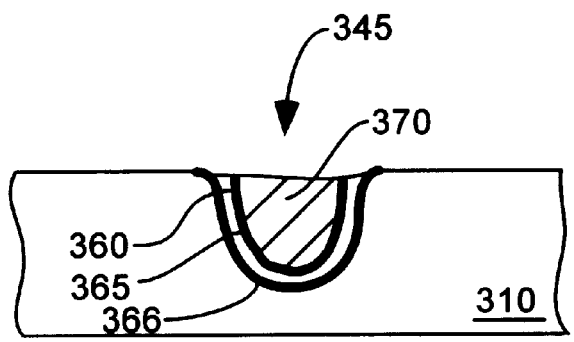
FIG. 3J illustrates a cross-sectional view of the structure in FIG. 3I after an etch-back step is performed.
Figure 3K:
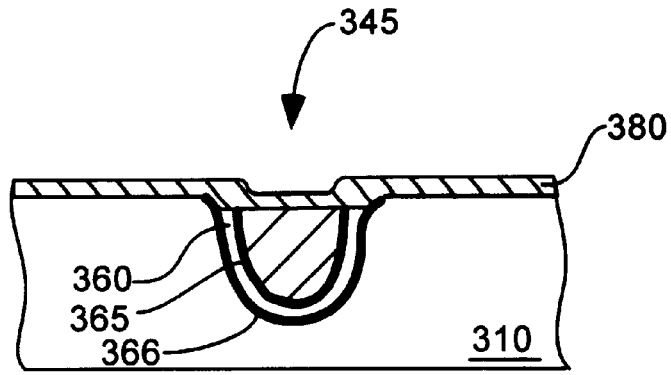
FIG. 3K illustrates a cross-sectional view of the structure in FIG. 3J after a thin gate oxide has been grown.
Figure 4A:
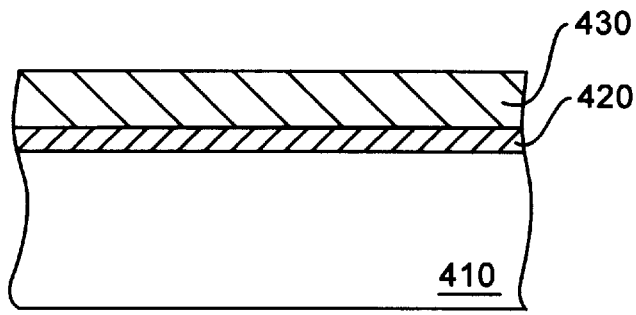
FIG. 4A is a illustrates a cross-sectional view of a semiconductor substrate with a pad oxide layer and a polish stop layer deposited thereon.
Figure 4B:
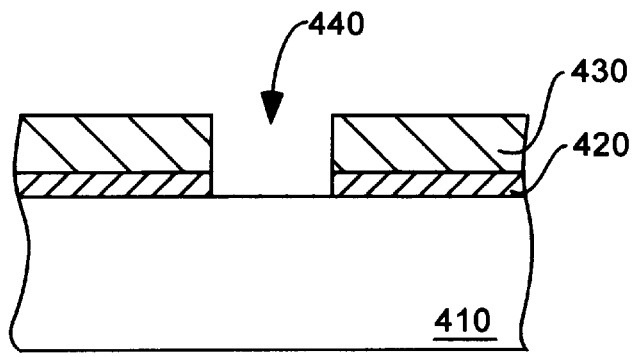
FIG. 4B illustrates a cross-sectional view of the structure in FIG. 4A after the pad oxide layer and polish stop layer have been patterned.

When forming a semiconductor device, an isolation trench may be formed adjacent an active region in order to isolate one active region from another. FIGS. 4A–L illustrate one embodiment of the present invention. FIG. 4A illustrates a semiconductor substrate 410 with a pad oxide layer 420 and a polish stop layer 430 deposited thereon. Semiconductor substrate 410 may be made up of silicon, and polish stop layer 430 may be made up of a nitride (e.g. silicon nitride). In one embodiment of the present invention, polish stop layer 430 has a thickness of approximately 1800 Å and pad oxide layer 420 has a thickness of approximately 100 Å. Polish stop layer 430 and pad oxide layer 420 are then patterned and etched to form an opening 440, as illustrated in FIG. 4B. It will be obvious to one with ordinary skill in the art that polish stop layer 430 and pad oxide layer 420 may be patterned using well known photolithographic masking and etching techniques (not shown).

Figure 4C:
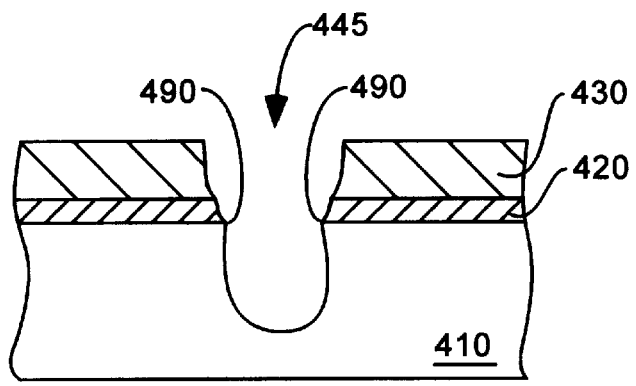
FIG. 4C illustrates a cross-sectional view of structure in FIG. 4B after a trench has been etched in the semiconductor substrate.
Figure 4D:
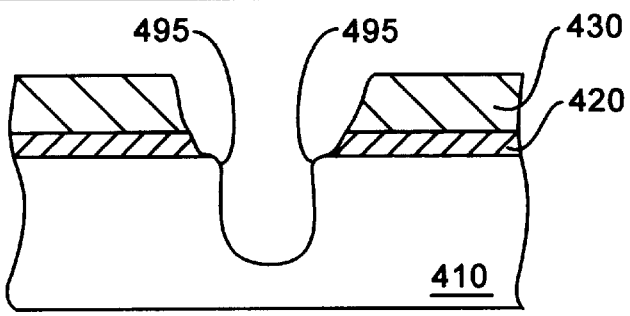
FIG. 4D illustrates a cross-sectional view of the structure in FIG. 4C after a preclean step has been performed which rounds the top corners of the trench.

After polish stop layer 430 and pad oxide layer 420 are patterned, the substrate 410 is etched to form a trench 445, as illustrated in FIG. 4C. After trench 445 is etched, however, the sidewalls of the trench are not clean, thus a preclean step is performed to remove debris from the trench sidewalls. The trench preclean step is performed using a chemistry made up of SC1, SC2, and HF. It should be noted that Standard Clean 1 (SC1) is a combination of $NH_4OH$, $H_2O_2$, and $H_2O$. The preclean step is performed for a duration long enough that the preclean chemistry will consume some of the silicon semiconductor substrate 410. The consumption of the silicon during the preclean step rounds the sharp top corners 490 of the trench reducing the "bird's beak" effect and forming round top corners 495, as illustrated in FIG. 4D. Thus, the longer the preclean step the greater the roundness of the top corners 495 of the trench. Because the top corners of trench 445 are rounded, they will not tend to carry high electric fields and yet will still permit the deposition of a more uniform thin gate oxide layer 480 (illustrated in FIG. 4L) for the formation of a semiconductor device in the active region adjacent the trench.

Figure 4E:
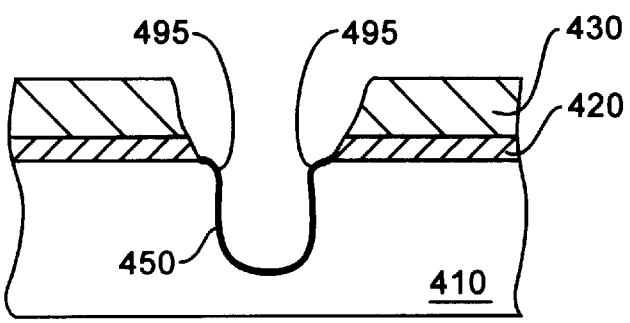
FIG. 4E illustrates a cross-sectional view of the structure in FIG. 4D.

After trench 445 is etched, the trench is subjected to a nitridation step in a nitrogen-oxide ($N_2O$) gas ambient and an anneal step. The nitridation and anneal steps form a silicon-oxy-nitride surface 450 along the trench 445, as illustrated in FIG. 4E. The silicon-oxy-nitride surface 450 acts as a retarding layer for subsequent oxide growth and provides an improved barrier to reduce boron outdiffusion into the trench. The addition of this nitridation step allows the thickness of the growth of subsequent oxide layers to be controlled to as low as 75 Å.

The anneal step may be performed in a vertical diffusion furnace (VDF) with an $N_2O$ gas ambient at a temperature of 900° or more for a duration in the range of approximately 5–35 minutes. Other nitridizing agents that can be annealed at temperatures in the range of 900–1200° C. may also be used, including but not limited to $N_2O$, NO, ammonia ($NH_3$), and a combination or mixture of these. In one embodiment of the present invention, the $N_2O$ gas ambient and anneal step is performed at a temperature of approximately 1000° C. for a duration of approximately 15 minutes.

Figure 4F:
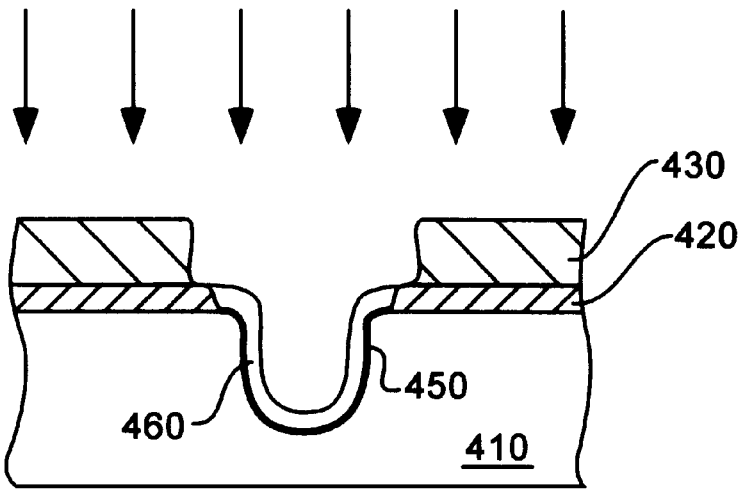
FIG. 4F illustrates a cross-sectional view of the structure in FIG. 4E during an $N_2O$ nitridation and anneal step.

Trench sidewall oxide 460 is then formed in the trench, as illustrated in FIG. 4F. Trench sidewall oxide 460 may be grown at a temperature in the range of approximately 900–1050° C. to a thickness in the range of approximately 75–250 Å. In one embodiment of the present invention, trench sidewall oxide 460 is a thermal oxide grown at a temperature of approximately 1000° C. and to a thickness of approximately 100 Å. High temperature oxidation oxidizes faster along trench corners as compared to the trench side walls. Thus, the high temperatures associated with the above oxidation process consume some of the semiconductor substrate and further round the top corners of said trench.

Note that prior art trench isolation techniques are unable to control the thickness of the trench sidewall oxide below 200 Å and yet still grow such a chlorinated oxide at the high temperatures required to round the top corners of the trench. The nitridation and anneal step applied to the trench 445 prior to the formation of the trench sidewall oxide layer slows down subsequent oxidation processes, such that the trench sidewall oxide layer 460 may be grown having a thickness of as low as 75 Å. For example, when the previous nitridation and anneal step is performed for approximately 15 minutes, the subsequent side wall oxide layer formed thereon will be approximately 100 Å. Further, when the previous nitridation and anneal step is performed for approximately 30 minutes, the subsequent side wall oxide layer formed thereon will be approximately 75 Å. Thus, the process of the present invention allows for thinner oxide growth in the formation of the trench sidewall oxide layer.

Figure 4G:
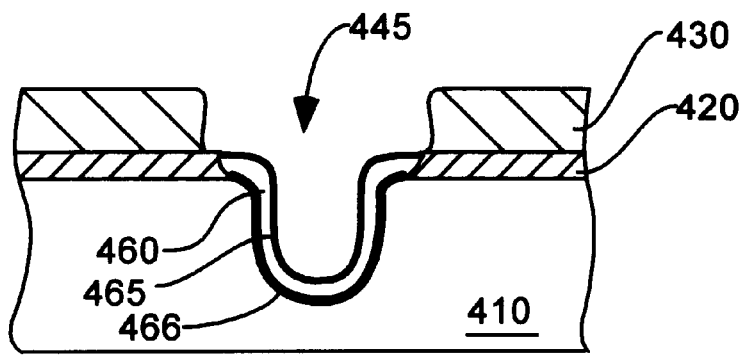
FIG. 4G illustrates a cross-sectional view of the structure in FIG. 4F after the oxy-nitride surface and silicon-oxy-nitride interface have been formed.

After the trench sidewall oxide 460 is formed, trench sidewall oxide 460 is subjected to an $N_2O$ nitridation step in a nitrogen-oxide ($N_2O$) gas ambient and anneal step, as illustrated in FIG. 4G. This second nitridation and anneal step further nitridizes the interface 466 between the trench side wall and the oxide layer 460, and forms an oxy-nitride surface 465 on the first oxide layer 460. The oxy-nitride surface 465 reduces the stresses in the trench, and the silicon oxy-nitride interface (barrier) 466 between the semiconductor substrate and the first oxide layer helps to eliminate dopant outdiffusion from the active region that is adjacent to the trench 445. Note that the additional nitridizing step for the interface between the trench side wall and the oxide layer 460, allows the silicon-oxy-nitride surface 466 to more efficiently reduce boron outdiffusion over the prior art single nitridizing step.

The anneal step may be performed in a VDF with an $N_2O$ gas ambient at a temperature of 900° C. or more for a duration in the range of approximately 5–35 minutes. In one embodiment of the present invention, the $N_2O$ gas ambient and anneal steps are performed at a temperature of approximately 1000° C. for a duration of approximately 15 minutes. As with the previous nitridation step, other nitridizing agents that may be annealed between 900–1200° C. may also be used.

Figure 4H:
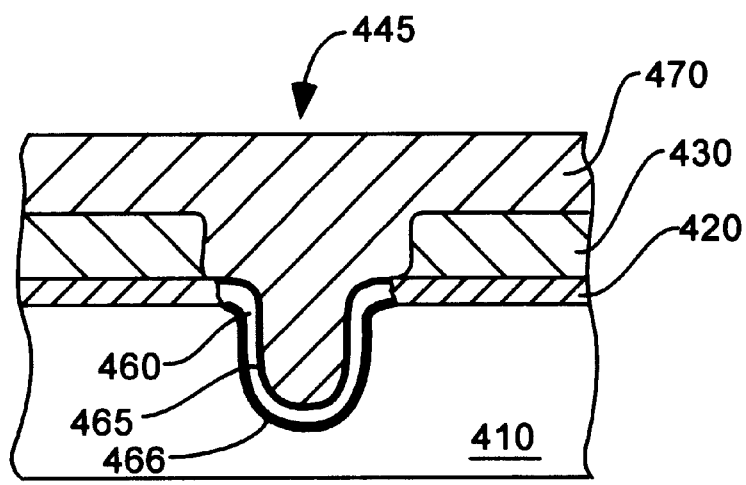
FIG. 4H illustrates a cross-sectional view of the structure in FIG. 4G after the trench has been completely filled with an oxide.

Next the trench is filled with an oxide to form trench fill oxide 470, as is illustrated in FIG. 4H. It should be noted and it will be obvious to one with ordinary skill in the art that the trench may be filled with oxide using chemical vapor deposition (CVD) techniques. For one embodiment of the present invention, the thickness of trench fill oxide 470 is highly dependent on the dimensions of the trench to be filled. In addition, the thickness of the trench fill oxide 470 should be chosen to provide adequate planarization and process control during the subsequent planarization etch back step. For another embodiment of the present invention, the trench fill oxide 470 may be formed by processes such as, for example, plasma enhanced CVD (PECVD), thermal CVD (ThCVD), or low pressure CVD (LPCVD), and may be formed using reactant species other than or in addition to TEOS and oxygen. For example, trench fill oxide 470 comprises a dopant to form phosphosilicate glass (PSG), borosilicate glass (BSG), or borophosphosilicate glass (BPSG).

An important aspect to consider when selecting the material used to fill the trench is that the material selected should be different than the underlying material used to mask the surface of the semiconductor substrate. For example, in one embodiment of the present invention in which a nitride layer is used as polish stop layer 430, the material used to fill the trench is preferably not a nitride. In this manner, processes and chemistries may be implemented during the subsequent planarization etch back process described below to ensure that the etch back of the trench filled material stops on the underlying masking layer. Note that for other embodiments of the present invention, the single CVD oxide layer used to fill the trench may be replaced by a multi-layer stack of trench materials suitable for the particular application in which they are employed.

Figure 4I:
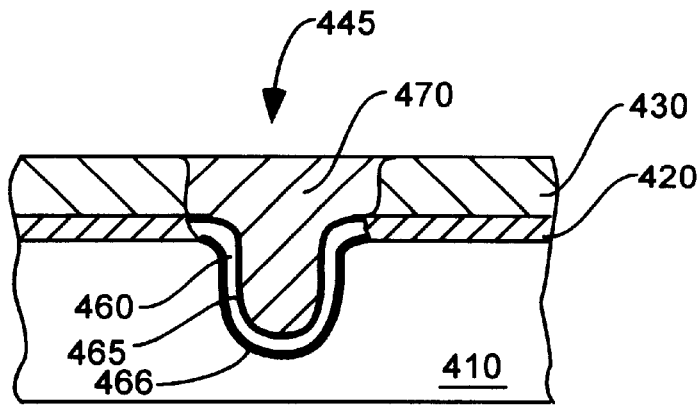
FIG. 4I illustrates a cross-sectional view of the structure in FIG. 4H after a polish step has been performed.
Figure 4J:
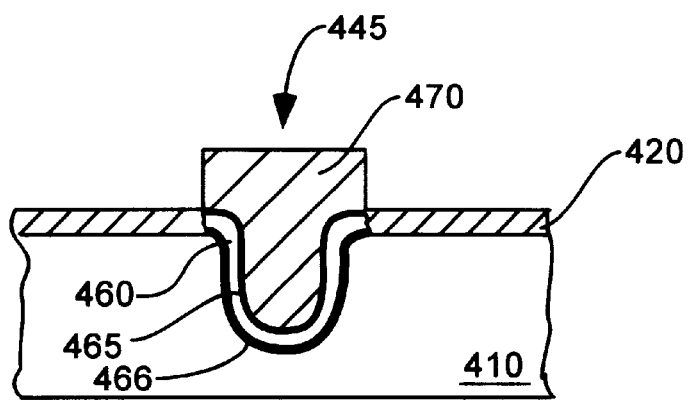
FIG. 4J illustrates a cross-sectional view of the structure in FIG. 4I after the polish stop layer has been removed.
Figure 4K:
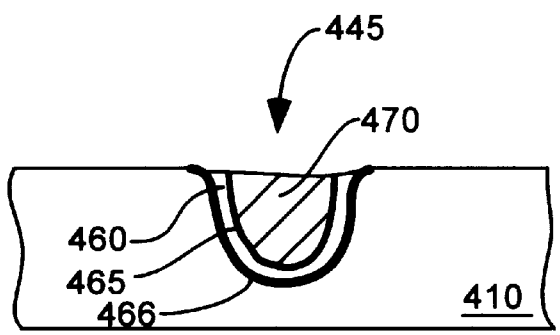
FIG. 4K illustrates a cross-sectional view of the structure in FIG. 4J after an etch-back step is performed.

After the trench is filled, trench fill oxide 470 is then polished (or planarized) in order to remove the excess oxide above polish stop layer 430, as is illustrated in FIG. 4I. As illustrated in FIG. 4J, polish stop layer 430 is then removed. It should be noted and it will be obvious to one with ordinary skill in the art that polish stop layer 430 may be removed using conventional etch techniques. After polish stop layer 430 is removed, an etch-back step is performed in order to isolate trench sidewall oxide 460 and trench fill oxide 470 within the trench, as is illustrated in FIG. 4J. It should be noted and it will be obvious to one with ordinary skill in the art that this etch-back step may be performed using chemical mechanical polishing (CMP) techniques.

The present invention addresses several problems that often occur in the prior art as a result of the use of trench isolation technology, including the "bird's beak" or sharp top corner effect. In the present application, the process of rounding the sharp top corners 490 of the trench 445 has been simplified to a one step process. As stated earlier the top corners 490 of the trench 445 are rounded during the oxidation process to form rounded top corners 495. Thus, rounded top corners 495 will not carry strong electric fields (e-fields).

Figure 4L:
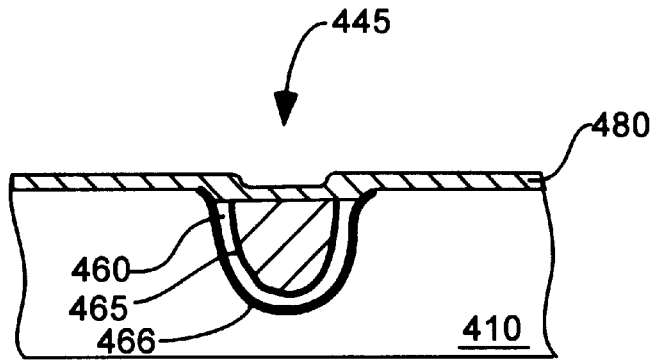
FIG. 4L illustrates a cross-sectional view of the structure in FIG. 4K after a thin gate oxide has been grown.

Other problems associated with sharp top corners in the formation of active regions on either side of the trench are also addressed. For example, when forming a transistor adjacent to the trench, a gate insulating oxide layer is grown over the substrate and over the trench, and since the top corners of the trench of the present invention are rounded, the gate oxide layer 480 is grown with a uniform thickness. As illustrated in FIG. 4L, the thickness of the thin gate oxide layer 480 at rounded top corners 495 is the same thickness (i.e. uniform thickness) as the gate oxide layer that lies on the horizontal surfaces of trench 445 and substrate 410. Thus, the thin gate oxide layer 480 is not as susceptible to break down when subjected to high electric fields. For example, once a transistor is formed and is functioning the rounded top corners 495 will more evenly distribute (or will not collect) e-fields and therefore will help prevent undesirable parasitic capacitances and leakage currents which degrade device performances.

Rounded top corners 495 will also aid the process of filling the trench. As stated above, the trench is generally filled using chemical vapor deposition (CVD) techniques to fill the trench with materials such as an oxide. Because the top corners of trench 445 are rounded, the CVD processes which subject the structure to plasma that tends to induce (or create) an electric field around sharp top corners will not induce such e-fields around the rounded top corners 495 of the present invention. Thus, the rounded top corners of the present invention enable a uniform deposition process and decreases the likelihood of the formation of gaps or voids in the trench fill.

Figure 5:
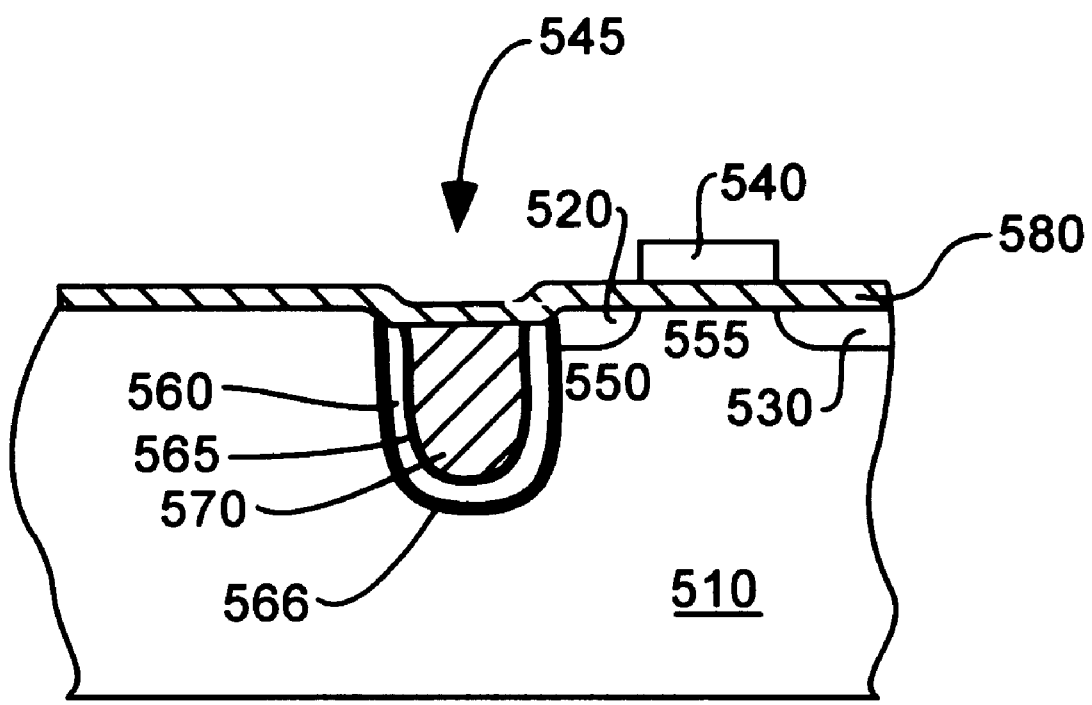
FIG. 5 illustrates a cross-sectional view of a semiconductor substrate with a pad oxide layer and a polish stop layer deposited thereon.

The present invention also addresses the problem associated with trench isolation technology of trench isolation stresses and outdiffusion of dopants from the semiconductor device region, for example from the source 520 and drain 530 regions of a transistor (illustrated in FIG. 5), into the trench 545 region. In particular, the present invention is able to reduce the outdiffusion of boron dopants in N-channel transistors. As stated earlier, outdiffusion is especially prominent in N-channel transistors that have narrow widths. Thus, as device dimensions decrease (e.g., narrower widths) the susceptibility to outdiffusion increases.

The present invention decreases or eliminates trench stresses and boron outdiffusion from N-channel transistors by creating an oxy-nitride surface 565 and a silicon-oxy-nitride interface 566. Oxy-nitride surface 565 reduces the stresses present in the trench isolation structures between the oxide layers. Silicon-oxy-nitride interface 566 reduces the boron dopants from diffusing into the trench sidewall oxide 560 and trench fill oxide 570. Thus, if the dopant concentration of the active region remains stable, the threshold voltage in the active region remains stable and is less susceptible to parasitic currents that degrade device performances. For example, if the dopants in the region 550 adjacent source region 520 are unable to outdiffuse into the trench 545, then the dopant concentration in region 550 will remain approximately the same as the dopant concentration in region 555. Therefore, the threshold voltage in region 550 will remain approximately the same as the threshold voltage in the region 555.

Controlling or preventing the outdiffusion of dopants using the present invention will also decrease the off-leakage current. As stated earlier, the off-leakage current is the parasitic (i.e. bad or unwanted) current that flows from the source 520 to the drain 530 of the transistor when the voltage applied to the gate 540 is zero (Vg=0), and the drain voltage ($V_d$) is at power supply voltage ($V_{cc}$) (i.e. in general a power supply may be $V_{cc}$=1.8 volts). It is desirable for the off-leakage current to be minimized such that the voltage at the source is zero ($V_s$=0). Since the use of the present invention reduces the outdiffusion of the dopants into the trench, for example dopants near the source region (for example, dopants from region 550) are no longer able to diffuse into the trench, the threshold voltage near the source region will remain approximately the same as the threshold voltage in the channel and drain regions. Thus, parasitic currents will not flow from the source 520 to the drain 530.

Another advantage of the present invention is that it enables the use of thinner gate oxide layers than prior art techniques. Due to the enablement of a more uniform growth of the gate oxide and the reduction of outdiffusion of dopants into the trench, in addition to the fabrication of narrower trench sidewall oxide layers, thinner gate oxides on the order of 25 Å or less may be used. Thus, as device characteristics shrink, for example move from 0.25$\mu$ technology to 0.18$\mu$ technology and lower, the trench isolation technology of the present invention enables the use of thinner gate oxides.

Thus, a method for forming $N_2O$ nitrided-oxide trench sidewalls to more efficiently reduce boron outdiffusion and substantially decrease stress has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

We claim:

1. A method to form an isolation region, comprising
    forming a trench in a substrate;
    exposing said trench to an ambient comprising nitrogen;
    forming an oxide layer in said trench; and
    exposing said oxide layer to an ambient comprising nitrogen to form a nitride interface between said substrate and said oxide.

2. The method of claim 1 wherein said ambient comprising nitrogen is a nitrogen-oxide gas.

3. The method of claim 1 wherein said nitride interface is a silicon-oxy-nitride layer.

4. The method of claim 1 wherein said exposing said oxide layer to an ambient comprising nitrogen forms a nitride layer on said oxide layer.

5. The method of claim 4 wherein said nitride layer is an oxy-nitride surface on said oxide layer.

6. The method of claim 1 wherein said exposing said trench to an ambient comprising nitrogen forms a silicon-oxy-nitride layer in said trench.

7. The method of claim 6 wherein said exposing said oxide layer to an ambient comprising nitrogen forms an oxy-nitride surface on said oxide layer.

8. A method to form an isolation structure in a semiconductor substrate, comprising:
    forming a trench in said semiconductor substrate;
    exposing said trench to an ambient comprising nitrogen to form a nitride layer in said trench;
    forming a first oxide layer within said trench; and
    exposing said first oxide layer to an ambient comprising nitrogen to form a nitride interface between said first oxide layer and said semiconductor substrate.

9. The method of claim 8 wherein said nitride layer in said trench is a silicon-oxy-nitride.

10. The method of claim 8 wherein said nitride interface is a silicon-oxy-nitride layer.

11. The method of claim 8 wherein said exposing said first oxide layer to an ambient comprising nitrogen also forms an oxy-nitride surface on said oxide layer.

12. The method of claim 8 further comprising forming a film layer on said oxide layer.

13. A method to form a trench isolation region, comprising:
    forming a trench in a substrate;
    forming an oxy-nitride layer in said trench;
    forming an oxide layer in said trench;
    forming an oxy-nitride surface on said oxide layer in said trench; and
    forming a second oxide layer on said oxy-nitride surface in said trench.

14. The method of claim 13 wherein said forming said oxy-nitride surface further comprises exposing said oxide layer to an ambient comprising nitrogen, and said forming said oxy-nitride layer in said trench further comprises exposing said oxide layer to an ambient comprising nitrogen.

15. The method of claim 14 wherein said exposing said oxide layer to an ambient comprising nitrogen also forms a nitride interface between said substrate and said oxide layer.

16. The method of claim 15 wherein said nitride interface is a silicon-oxy-nitride layer.

17. A method to form an isolation structure in a semiconductor substrate, comprising:
    forming a trench in said semiconductor substrate;
    exposing said trench to an ambient comprising nitrogen;
    forming a first oxide layer within said trench;
    exposing said first oxide layer to an ambient comprising nitrogen to form a nitride interface between said first oxide layer and said trench; and,
    forming a second oxide layer over said nitride interface of said first oxide layer.

18. The method of claim 17 wherein said first oxide layer is formed by growing a thermal oxide within said trench.

19. The method of claim 17 wherein said second oxide layer is deposited by chemical vapor deposition (CVD), plasma enhanced chemical vapor deposition (PECVD), thermal chemical vapor deposition (ThCVD), low pressure deposition (LPCVD), or any combination thereof.

20. The method of claim 17 wherein said second oxide layer is formed from a substantially undoped oxide layer.

21. The method of claim 17 wherein said second oxide layer is formed from borosilicate glass (BSG), phosphosilicate glass (PSG), borophosphosilicate glass (BPSG), or any combination thereof.

22. A method to form an isolation structure in a semiconductor substrate, comprising:
    forming a pad oxide layer above said semiconductor substrate;
    forming a polish stop layer above said pad oxide layer;
    patterning and etching said polish stop layer and said pad oxide layer;
    etching a trench in said semiconductor substrate;
    subjecting said trench to an ambient comprising nitrogen to form a silicon-oxy-nitride surface along said trench;
    forming a first oxide layer within said trench;
    subjecting said first oxide layer to an ambient comprising nitrogen to form an oxy-nitride surface on said first oxide layer and a silicon-oxy-nitride interface between said first oxide layer and said semiconductor substrate;

forming a second oxide layer over said oxy-nitride surface of said first oxide layer;

polishing said second oxide layer in order to remove the portion of said second oxide layer above said polish stop layer;

removing said polish stop layer;

etching back to isolate said first and second oxide layers within said trench; and, forming a thin gate oxide layer over said semiconductor substrate and said trench.

23. The method of claim 22 wherein said semiconductor substrate comprises silicon.

24. The method of claim 22 wherein said polish stop layer comprises a nitride layer.

25. The method of claim 22 wherein said first oxide layer comprises a thermal oxide.

26. The method of claim 22 wherein said second oxide layer is deposited by chemical vapor deposition (CVD), plasma enhanced chemical vapor deposition (PECVD), thermal chemical vapor deposition (ThCVD), low pressure chemical vapor deposition (LPCVD), or any combination thereof.

27. The method of claim 22 wherein said second oxide layer is a substantially undoped oxide layer.

28. The method of claim 22 wherein said second oxide layer is formed from borosilicate glass (BSG), phosphosilicate glass (PSG), borophosphosilicate glass (BPSG), or any combination thereof.

* * * * *

UNITED STATES PATENT AND TRADEMARK OFFICE
CERTIFICATE OF CORRECTION

PATENT NO. : 6,153,480
DATED : November 28, 2000
INVENTOR(S) : Arghavani et al.

It is certified that error appears in the above-identified patent and that said Letters Patent is hereby corrected as shown below:

Column 2
Line 45, delete "($V_8 = 0$)" and insert -- ($V_s = 0$) --.

Signed and Sealed this

Thirtieth Day of April, 2002

Attest:

Attesting Officer

JAMES E. ROGAN
Director of the United States Patent and Trademark Office